(12) United States Patent  (10) Patent No.: US 8,741,670 B2
Katsuyama  (45) Date of Patent: *Jun. 3, 2014

(54) METHOD FOR PRODUCING INTEGRATED OPTICAL DEVICE

(71) Applicant: Sumitomo Electric Industries, Ltd., Osaka (JP)

(72) Inventor: Tomokazu Katsuyama, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/741,683

(22) Filed: Jan. 15, 2013

(65) Prior Publication Data

US 2013/0183778 A1   Jul. 18, 2013

(30) Foreign Application Priority Data

Jan. 18, 2012 (JP) ................................. 2012-008290

(51) Int. Cl.
*H01L 33/00* (2010.01)

(52) U.S. Cl.
USPC ............................................. 438/27; 438/47

(58) Field of Classification Search
USPC .................................................... 438/22–47
See application file for complete search history.

(56) References Cited

U.S. PATENT DOCUMENTS

| 4,791,647 | A  | 12/1988 | Sugou |
| 5,220,573 | A  | 6/1993  | Sakata et al. |
| 5,335,241 | A  | 8/1994  | Okumura et al. |
| 5,862,168 | A  | 1/1999  | Schilling |
| 6,455,338 | B1 * | 9/2002 | Takagi et al. .................... 438/24 |
| 6,596,558 | B2 * | 7/2003 | Kim et al. ........................ 438/31 |
| 2002/0001328 | A1 | 1/2002 | Albrecht et al. |
| 2003/0067953 | A1 | 4/2003 | Kim et al. |
| 2004/0179569 | A1 | 9/2004 | Sato et al. |
| 2006/0039437 | A1 | 2/2006 | Albrecht et al. |
| 2006/0050752 | A1 | 3/2006 | Nunoya et al. |
| 2007/0223857 | A1 | 9/2007 | Nunoya et al. |
| 2008/0003704 | A1 | 1/2008 | Katsuyama |
| 2009/0117676 | A1 | 5/2009 | Katsuyama |

(Continued)

FOREIGN PATENT DOCUMENTS

| JP | 2002-243964 | 8/2002 |
| JP | 2005-55764  | 3/2005 |
| JP | 2010-283104 | 12/2010 |

*Primary Examiner* — Savitr Mulpuri
(74) *Attorney, Agent, or Firm* — Smith, Gambrell & Russell LLP

(57) ABSTRACT

A method for producing an integrated optical device includes the steps of growing a first stacked semiconductor layer including a first optical waveguiding layer, a first cladding layer, and a side-etching layer; etching the first stacked semiconductor layer through a first etching mask; growing, a second stacked semiconductor layer including a second optical waveguiding layer and a second cladding layer through the first etching mask; and forming a reverse-mesa ridge structure by etching the first and second cladding layers. The step of etching the first stacked semiconductor layer includes a step of forming an overhang by etching the side-etching layer by wet etching. In the step of growing the second stacked semiconductor layer, the second cladding layer is grown at a lower growth temperature and a higher V/III ratio comparing to those in the growth of the second optical waveguiding layer.

7 Claims, 17 Drawing Sheets

(56) References Cited

U.S. PATENT DOCUMENTS

| | | |
|---|---|---|
| 2009/0129418 A1 | 5/2009 | Matsumura |
| 2010/0112741 A1 | 5/2010 | Rosso et al. |
| 2011/0091151 A1* | 4/2011 | Hashimoto .................... 385/14 |
| 2012/0122257 A1* | 5/2012 | Yashima et al. ................ 438/40 |
| 2012/0270347 A1* | 10/2012 | Yagi ................................ 438/31 |
| 2013/0010824 A1* | 1/2013 | Okumura et al. .......... 372/45.01 |
| 2013/0183783 A1* | 7/2013 | Katsuyama .................... 438/47 |
| 2013/0183784 A1* | 7/2013 | Katsuyama et al. ............ 438/47 |

\* cited by examiner

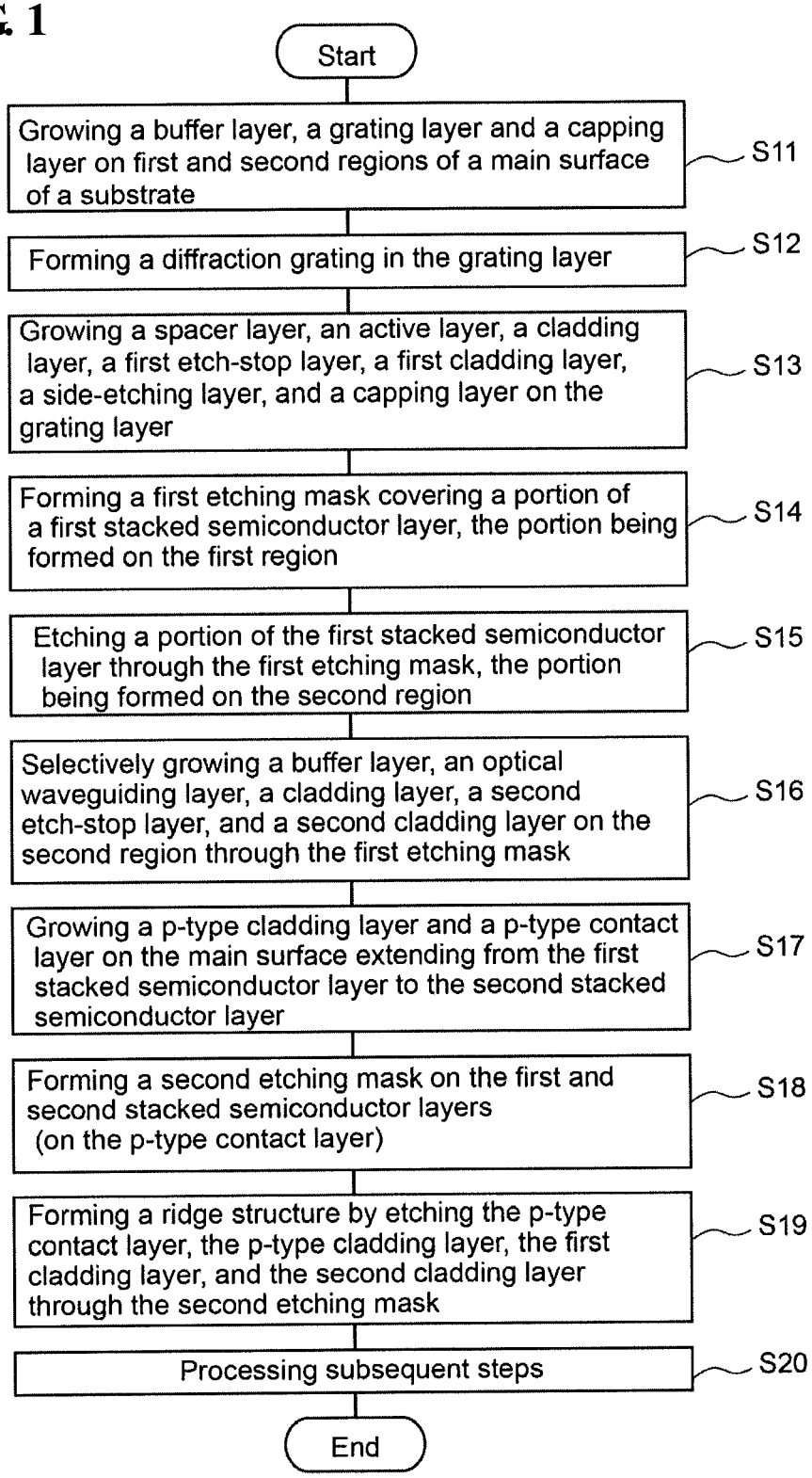

METHOD FOR PRODUCING INTEGRATED OPTICAL DEVICE

BACKGROUND OF THE INVENTION

1. Field of the Invention

The present invention relates to a method for producing an integrated optical device.

2. Description of the Related Art

Patent Reference 1 (Japanese Unexamined Patent Application Publication No. 2002-243964) describes the following method for producing an integrated optical device having a butt-joint structure. A first optical waveguiding layer including a first lower optical guiding layer, an active layer, and a first upper optical guiding layer, and a first upper cladding layer are sequentially grown on an InP substrate. Portions of the first upper cladding layer, the first upper optical guiding layer, and the active layer are removed by dry etching through an etching mask formed on the first upper cladding layer. The first optical waveguiding layer is then etched by a wet etching technique through the etching mask. At this time, a side surface of the first optical waveguiding layer undergoes side etching. On the InP substrate having been exposed by the wet etching, a second optical waveguiding layer and a second upper cladding layer are sequentially grown. Thus, the butt-joint coupling between the first optical waveguiding layer and the second optical waveguiding layer is achieved.

SUMMARY OF THE INVENTION

FIGS. 14A to 16B illustrate an example of a method for producing an integrated optical device having a butt-joint structure. The integrated optical device is produced in the following manner. Referring to FIG. 14A, an InP lower cladding layer 112, an optical waveguiding layer 114, an InP upper cladding layer 116, and a side-etching layer 117 that are to constitute a first stacked semiconductor layer are grown on a semiconductor substrate 102. The side-etching layer 117 is etched faster than the InP upper cladding layer 116 and hence can be selectively etched. The side-etching layer 117 is formed of, for example, InGaAsP. Subsequently, referring to FIG. 14B, a mask 118 for covering a portion that is to serve as a first stacked semiconductor layer 110 is formed. A portion other than the first stacked semiconductor layer 110 is then removed by etching through the mask 118. At this time, the side-etching layer 117 is selectively etched by wet etching to form an overhang between the mask 118 and the InP upper cladding layer 116. After that, portions of the InP upper cladding layer 116, the optical waveguiding layer 114, and the InP lower cladding layer 112 are removed by etching.

Referring to FIG. 14C, an InP lower cladding layer 122, an optical waveguiding layer 124, and an InP upper cladding layer 126 that are to constitute a second stacked semiconductor layer 120 are selectively grown on the semiconductor substrate 102 through the mask 118. At this time, the overhang formed between the mask 118 and the InP upper cladding layer 116 suppresses abnormal growth of the InP upper cladding layer 126. In addition, the InP upper cladding layer 126 is formed so as to have a substantially flat surface.

The mask 118 is then removed. Referring to FIG. 15A, an InP cladding layer 130 and a contact layer 132 are subsequently grown over the side-etching layer 117 and the InP upper cladding layer 126. After that, referring to FIG. 15B, a stripe-shaped mask 134 is formed on the contact layer 132. The contact layer 132, the InP cladding layer 130, and the InP upper cladding layers 116 and 126 are then etched through the mask 134. As a result of the above-described steps, a ridge structure 140 illustrated in FIG. 16A is formed. However, in this production method, the following problem is caused during the formation of the ridge structure 140. FIG. 16B illustrates a section taken along line V-V in FIG. 16A, that is, a section perpendicular to the longitudinal direction of the ridge structure 140. In order to form the ridge structure 140, the contact layer 132, the InP cladding layer 130, and the InP upper cladding layers 116 (126) are etched by wet etching. As a result of this etching, the ridge structure 140 can be formed such that its side surfaces have a specific crystal plane (for example, the (111) plane of an InP crystal). The ridge structure 140 may be formed such that the section thereof has a reverse-mesa structure. In this case, when the side-etching layer 117 is present between the InP upper cladding layer 116 and the InP cladding layer 130, as illustrated in FIG. 16B, stepped structures (portions B in FIG. 16B) are formed due to difference in etching rates for the side-etching layer 117, the InP upper cladding layer 116, and the InP cladding layer 130.

In general, in the formation of a reverse-mesa ridge structure, the width (width in a direction orthogonal to the waveguiding direction) of the upper end of the ridge structure is desirably maximized. On the other hand, the width of the lower end of the ridge structure is desirably minimized. By increasing the width of the upper end of the ridge structure, the contact area between the electrode and the ridge structure can be increased. As a result, the contact resistance between the electrode and the contact layer of the ridge structure can be decreased. By decreasing the width of the lower end of the ridge structure, a current passing through the optical waveguiding layer 114 can be effectively confined.

However, when the first stacked semiconductor layer 110 includes the side-etching layer 117, as illustrated in FIG. 16B, stepped structures B are formed in the side surfaces of the ridge structure 140. As a result, the width WA of the upper end of the ridge structure 140 becomes close to the width WB of the lower end of the ridge structure 140. Accordingly, it is difficult to make the width WA large and make the width WB small.

A method for producing an integrated optical device according to an aspect of the present invention includes the steps of preparing a substrate including a main surface including first and second regions arranged in a predetermined direction; growing, on the first and second regions of the substrate, a first stacked semiconductor layer including a first optical waveguiding layer, a first cladding layer positioned on the first optical waveguiding layer, and a side-etching layer positioned on the first cladding layer, the side-etching layer having a composition different from a composition of the first cladding layer; etching the first stacked semiconductor layer through a first etching mask formed on the first region until the first optical waveguiding layer is exposed; selectively growing, on the second region through the first etching mask, a second stacked semiconductor layer including a second optical waveguiding layer coupled to the first optical waveguiding layer and a second cladding layer positioned on the second optical waveguiding layer; and forming a reverse-mesa ridge structure by etching the first and second cladding layers through a second etching mask formed on the first and second stacked semiconductor layers, the second etching mask longitudinally extending in the predetermined direction. The step of etching the first stacked semiconductor layer includes a step of forming an overhang between the first etching mask and the first cladding layer by selectively etching the side-etching layer by wet etching with an etchant having a higher etching rate for the side-etching layer than for the first cladding layer. In addition, in the step of selectively growing the second stacked semiconductor layer, the second cladding layer is grown at a growth temperature lower than a growth temperature of the second optical waveguiding layer and a V/III ratio higher than a V/III ratio in the growth of the second optical waveguiding layer.

As described above, when the first stacked semiconductor layer includes a side-etching layer, the width of the upper end of the ridge structure becomes close to the width of the lower end of the ridge structure. As a result, it is difficult to achieve a large width of the upper end and a small width of the lower end. In order to address such a problem, the thickness of the first cladding layer may be increased. Specifically, since the inclinations of the side surfaces of the ridge structure 140 in FIG. 16B are constant, by increasing the thickness of the upper cladding layer 116, the width WA of the upper end of the ridge structure 140 can be made large and the width WB of the lower end of the ridge structure 140 can be made small.

However, when the thickness of the upper cladding layer 116 is increased, the following problem is caused. FIG. 17 illustrates a case where the thickness of the upper cladding layer 116 is increased and the second stacked semiconductor layer 120 is grown. As illustrated in FIG. 17, when the thickness of the upper cladding layer 116 is increased, the upper cladding layer 126 of the second stacked semiconductor layer 120 also needs to be grown so as to have a large thickness. However, when the upper cladding layer 126 is grown so as to have a large thickness under normal growth conditions, a recess is generated in the surface of the upper cladding layer 126 as illustrated in a portion D in FIG. 17. In general, in the growth of semiconductor layers such as the upper cladding layer 126 on a main surface (for example, the (001) plane of InP) of the semiconductor substrate 102, growth conditions are determined such that a growth rate in a direction perpendicular to the main surface of the semiconductor substrate 102 becomes a predetermined rate. On the other hand, a growth rate on a butt-joint surface of the first stacked semiconductor layer 110, the butt-joint surface forming a predetermined angle with respect to the main surface of the semiconductor substrate 102, is lower than the growth rate on the main surface of the semiconductor substrate 102. In particular, when the butt-joint surface of the first stacked semiconductor layer 110 includes the (111) plane, the growth rate on the butt-joint surface of the first stacked semiconductor layer 110 becomes much lower than the growth rate on the main surface of the semiconductor substrate 102. Accordingly, the recess is probably generated because a growth rate of the upper cladding layer 126 on the main surface (for example, the (001) plane of InP) of the semiconductor substrate 102 is higher than a growth rate of the upper cladding layer 126 on the butt-joint surface (for example, the (111) plane) of the first stacked semiconductor layer 110.

In order to suppress generation of the recess D so that the cladding layer is formed so as to have a flat surface, in the above-described production method, in the second growth step, a growth temperature for the second cladding layer is made lower than a growth temperature for the second optical waveguiding layer and a V/III ratio in the growth of the second cladding layer is made higher than a V/III ratio in the growth of the second optical waveguiding layer.

In the above-described method for producing an integrated optical device, in the step of selectively growing the second stacked semiconductor layer, the second cladding layer is grown under the growth conditions so that a growth rate of the second cladding layer is preferably increased on a side surface of the first stacked semiconductor layer exposed in the step of etching the first stacked semiconductor layer, and a growth rate of the second cladding layer is preferably decreased on the main surface of the substrate. When the second optical waveguiding layer and the second cladding layer are grown under the growth conditions, generation of the recess D as illustrated in FIG. 17 can be suppressed. Accordingly, the thickness of the first cladding layer of the first stacked semiconductor layer can be sufficiently increased. As a result, the width of the upper end of the ridge structure can be made large and the width of the lower end of the ridge structure can be made small.

In the above-described method for producing an integrated optical device, the main surface of the substrate may include a (001) plane. In the step of etching the first stacked semiconductor layer, the first stacked semiconductor layer may be etched by wet etching. In addition, a side surface of the first stacked semiconductor layer exposed by the etching may include a (111) plane. When the main surface of the semiconductor substrate includes a (001) plane and the butt-joint surface of the first stacked semiconductor layer includes a (111) plane, the above-described growth conditions in terms of the second optical waveguiding layer and the second cladding layer are effectively used. Specifically, under a normal condition for the growth of a semiconductor layer on the (001) plane, a growth rate of a semiconductor layer on the (111) plane becomes lower than a growth rate of the semiconductor layer on the (001) plane. However, by employing the above-described growth conditions in terms of the second optical waveguiding layer and the second cladding layer, even when the butt-joint surface includes the (111) plane, a growth rate of the second cladding layer on the butt-joint surface can be effectively increased. In addition, a growth rate of the second cladding layer on the main surface of the semiconductor substrate can be decreased.

In the above-described method for producing an integrated optical device, in the step of etching the first stacked semiconductor layer, the first stacked semiconductor layer is preferably etched with different etchants selected for the first optical waveguiding layer, the first cladding layer, and the side-etching layer in the first stacked semiconductor layer.

In the above-described method for producing an integrated optical device, in the step of growing the first stacked semiconductor layer, the first cladding layer may have a thickness of 1.41 μm or more. When the above-described production method is employed, the thickness of the first cladding layer can be increased to such a large thickness. Accordingly, the width of the upper end of the ridge structure can be effectively made large and the width of the lower end of the ridge structure can be effectively made small.

In the above-described method for producing an integrated optical device, in the step of forming the reverse-mesa ridge structure, the ridge structure may have an upper end having a width of 4.5 μm or more in a direction orthogonal to the predetermined direction, and the ridge structure may have a lower end having a width of 2.5 μm or less in the direction orthogonal to the predetermined direction.

In the above-described method for producing an integrated optical device, in the step of forming the reverse-mesa ridge structure, the first and second cladding layers may be etched by dry etching, and after etching by dry etching, the first and second cladding layers may be subsequently etched by wet etching.

BRIEF DESCRIPTION OF THE DRAWINGS

FIG. 1 is a flow chart of a method for producing an integrated optical device according to an embodiment of the present invention.

DESCRIPTION OF THE PREFERRED EMBODIMENTS

Hereinafter, methods for producing an integrated optical device according to embodiments of the present invention will be described in detail with reference to attached drawings. In descriptions of the drawings, like reference signs are used to denote like elements and redundant descriptions are omitted.

In the production methods described below, semiconductor layers are suitably formed by, for example, a metal-organic vapor phase epitaxy (MOVPE) method. Suitable examples of an n-type dopant include Sn and Si. Suitable examples of a p-type dopant include Zn. Values in parentheses representing the thicknesses of semiconductor layers are mere examples. If necessary, the thicknesses of semiconductor layers can be increased or decreased.

FIG. 1 is a flow chart of a method for producing an integrated optical device according to an embodiment of the present invention. FIGS. 2A to 13B are perspective views and sectional views illustrating the steps in FIG. 1.

<First Growth Step>

Figure 2A:
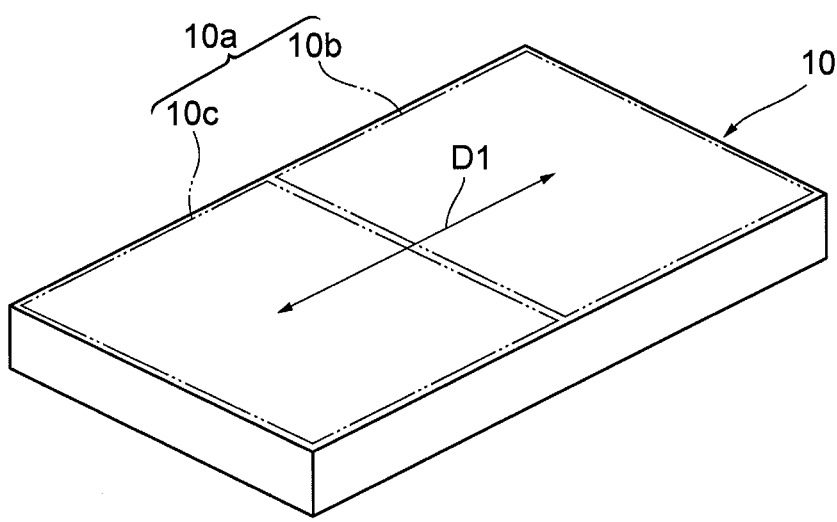
FIGS. 2A and 2B illustrate a first growth step.

In this production method, referring to FIG. 2A, an n-type InP substrate 10 having a main surface 10a is prepared. The n-type InP substrate 10 serves as a substrate in the embodiment. The n-type InP substrate 10 includes a first region 10b and a second region 10c that are arranged in a predetermined direction (arrow D1 in FIG. 2A). Specifically, the main surface 10a of the n-type InP substrate 10 includes a first region 10b and a second region 10c. The predetermined direction is a waveguiding direction in the integrated optical device in the embodiment. The main surface 10a mainly includes the (001) plane of the crystalline InP substrate. The predetermined direction D1 preferably corresponds to the <110> direction of the InP substrate.

Figure 2B:
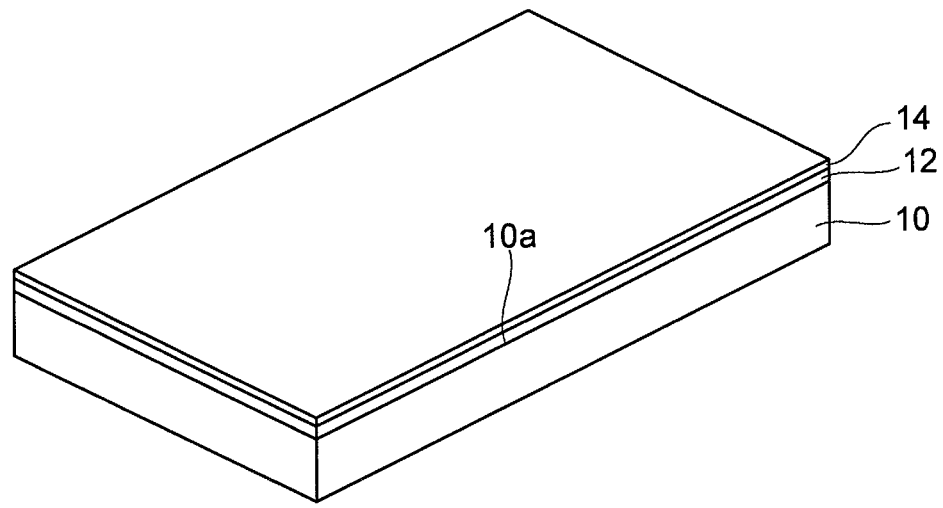

Referring to FIG. 2B, on the main surface 10a (first region 10b and second region 10c) of the n-type InP substrate 10, a buffer layer 12 (thickness: 500 nm), a grating layer 14 (thickness: 80 nm), and a capping layer (thickness: 10 nm; not shown) are then grown in this order (step S11 in FIG. 1). The buffer layer 12 and the capping layer are formed of, for example, n-type InP. The grating layer 14 is formed of a material having a higher refractive index than the buffer layer 12 and the capping layer. The grating layer 14 is formed of, for example, n-type InGaAsP. The grating layer 14 has a bandgap wavelength of, for example, 1330 nm. Here, the bandgap wavelength is related to the bandgap energy of a semiconductor material. Furthermore, the bandgap energy Eg (eV) and the bandgap wavelength λg (μm) have the relationship of λg=1.24/Eg. The n-type InP substrate 10, the buffer layer 12, the grating layer 14, and the capping layer have an impurity concentration of, for example, $5 \times 10^{17}$ cm$^{-3}$.

An etching mask is then formed on the grating layer 14 by an interference exposure method. After that, the grating layer 14 is etched through this etching mask (preferably by a dry etching process). As a result, referring to FIG. 3A, a diffraction grating is formed in the grating layer 14 (step S12 in FIG. 1).

Figure 3A:
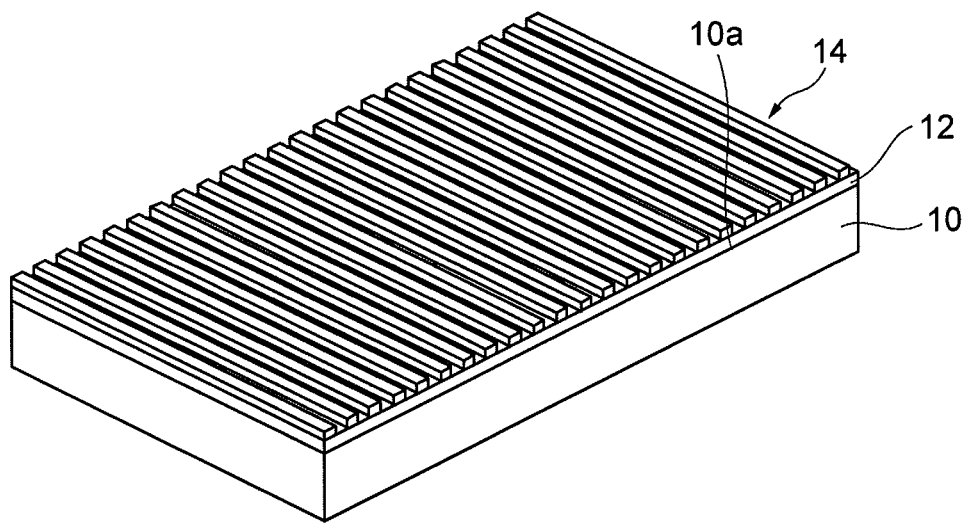
FIGS. 3A and 3B illustrate a first growth step.
Figure 3B:
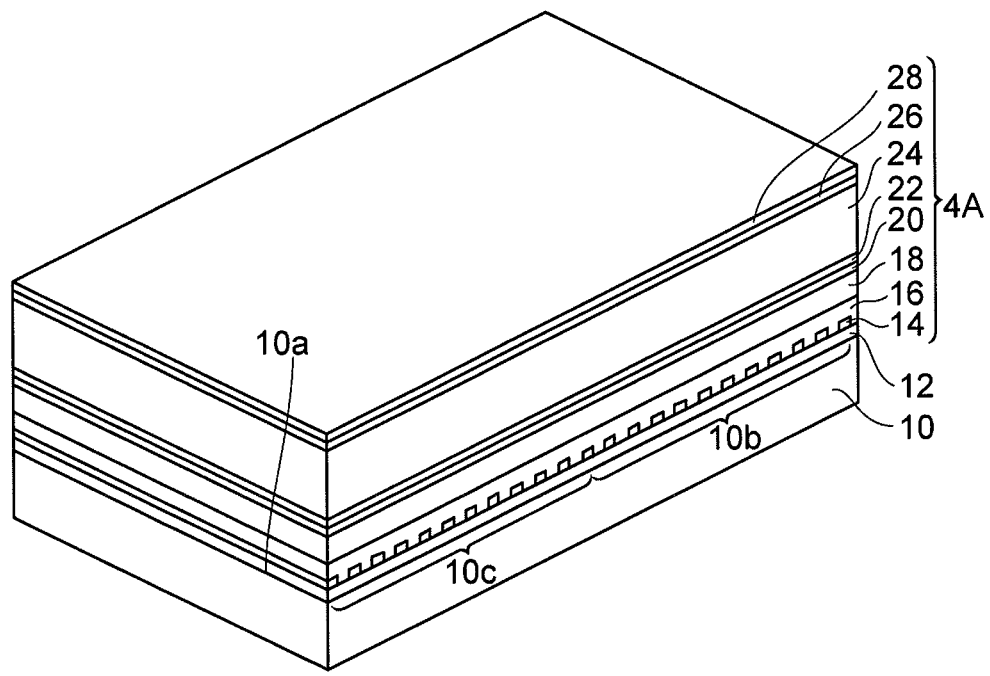

Referring to FIG. 3B, on the grating layer 14 in which the diffraction grating is formed, a spacer layer 16 (thickness with respect to the upper surface of the grating layer 14: 100 nm), an active layer 18, a cladding layer 20 (thickness: 60 nm), a first etch-stop layer 22 (thickness: 10 nm), a cladding layer 24 (thickness: 1500 nm), a side-etching layer 26 (thickness: 20 nm), and a capping layer 28 (thickness: 20 nm) are grown in this order (step S13 in FIG. 1). The spacer layer 16 is formed of, for example, n-type InP. The cladding layer 20 and the cladding layer 24 are formed of, for example, p-type InP. The cladding layer 24 serves as a first cladding layer in the embodiment. The cladding layer 24 has a larger thickness than a thickness of the cladding layer of the conventional integrated optical device having a 460 nm-thick cladding layer, for example. The cladding layer 24 has a thickness in the range between 1.41 μm and 2.5 μm.

The first etch-stop layer 22 is different in composition from the cladding layer 20 and the cladding layer 24 and is disposed between the cladding layer 20 and the cladding layer 24. Specifically, the first etch-stop layer 22 is formed of a material allowing etching selectivity with respect to the cladding layer 20 and the cladding layer 24. The first etch-stop layer 22 is formed of, for example, p-type InGaAsP. The first etch-stop layer 22 has a bandgap wavelength of, for example, 1100 nm.

The side-etching layer 26 is formed of a material allowing etching selectivity with respect to the cladding layer 24. The side-etching layer 26 is formed of, for example, p-type InGaAsP. The side-etching layer 26 has a bandgap wavelength of, for example, 1150 nm. The capping layer 28 is formed of, for example, p-type InP. The spacer layer 16, the cladding layer 20, the first etch-stop layer 22, the cladding layer 24, the side-etching layer 26, and the capping layer 28 have an impurity concentration of, for example, $5 \times 10^{17}$ cm$^{-3}$.

The active layer 18 serves as a first optical waveguiding layer in the embodiment. For example, the active layer 18 has a multi quantum well (MQW) structure in which a barrier layer and a well layer are alternately stacked. The barrier layer is formed of, for example, InGaAsP, and has a bandgap wavelength of, for example, 1200 nm. The well layer is formed of, for example, InGaAsP. The composition of the well layer is adjusted such that light emitted from the active layer 18 has a wavelength of for example, 1550 nm. Specifically, the well layer is formed of, for example, InGaAsP having a bandgap wavelength of 1590 nm. For example, the barrier layer has a thickness of 10 nm and the well layer has a thickness of 5 nm.

The well layer may have, for example, 1% compressive strain. The number of the well layer is, for example, seven.

Separate confinement heterostructure (SCH) layers having a composition providing a smaller refractive index than the active layer 18 may be further disposed as an overlying layer and an underlying layer of the active layer 18. The SCH layers are formed of, for example, InGaAsP of which composition has a bandgap wavelength of, for example, 1150 nm. The overlying and underlying SCH layers each have a thickness of, for example, 50 nm.

As a result of the above-described steps, a first stacked semiconductor layer 4A illustrated in FIG. 3B is formed on the main surface 10a of the n-type InP substrate 10. The first stacked semiconductor layer 4A includes the grating layer 14, the spacer layer 16, the active layer 18, the cladding layer 20, the first etch-stop layer 22, the cladding layer 24, the side-etching layer 26, and the capping layer 28. A portion of the first stacked semiconductor layer 4A, the portion being formed on the first region 10b, functions as a distributed feedback (DFB) laser diode.

<First Etching Step>

Figure 4:
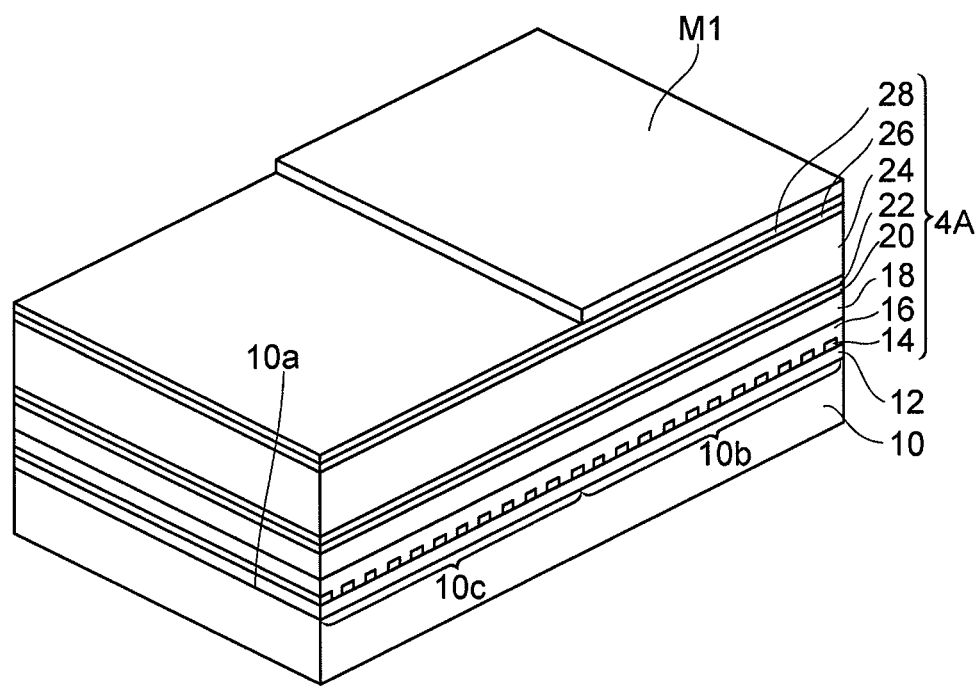
FIG. 4 illustrates a first etching step.

Referring to FIG. 4, a first etching mask M1 covering a portion of the first stacked semiconductor layer 4A, the portion being formed on the first region 10b, is then formed on the first stacked semiconductor layer 4A (step S14 in FIG. 1). The first etching mask M1 is a dielectric film formed of, for example, $SiO_2$ or SiN. For example, the first etching mask M1 is deposited on the first stacked semiconductor layer 4A by a chemical vapor deposition (CVD) method. After that, a resist mask is formed on the first etching mask M1 by the standard photolithography technique. The first etching mask M1 is etched through the resist mask. As a result of such processes, the first etching mask M1 is suitably formed.

Figure 5A:
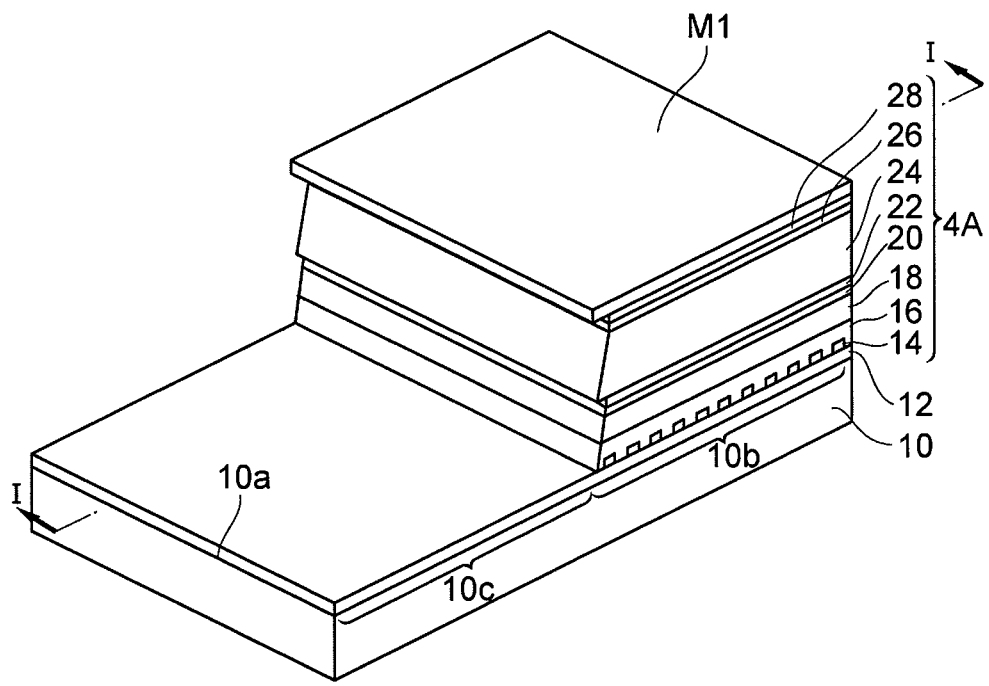
FIGS. 5A and 5B illustrate a first etching step.

Referring to FIG. 5A, a portion of the first stacked semiconductor layer 4A, the portion being formed on the second region 10c, is then etched through the first etching mask M1 by, for example, wet etching. As a result of this etching, the active layer 18 is exposed (step S15 in FIG. 1). For example, in the embodiment, etching is performed with different etchants selected for semiconductor layers of the first stacked semiconductor layer 4A until the buffer layer 12 is exposed. In particular, the side-etching layer 26 and the first etch-stop layer 22 are etched by wet etching with an etchant having higher etching rates for these layers than for the capping layer 28, the cladding layer 24, and the cladding layer 20.

In an example, an etchant containing hydrochloric acid and acetic acid is used for etching the capping layer 28. On the other hand, an etchant containing hydrogen bromide is used for etching the cladding layer 24, the cladding layer 20, and the spacer layer 16 that are mainly formed of InP. Another etchant containing sulfuric acid and hydrogen peroxide is used for etching the side-etching layer 26 and the first etch-stop layer 22 that are mainly formed of InGaAsP. As a result, these layers can be etched faster than the capping layer 28, the cladding layer 24, and the cladding layer 20. The active layer 18 and the grating layer 14 that are mainly formed of InGaAsP are preferably etched with an etchant containing hydrochloric acid and hydrogen peroxide.

Figure 5B:
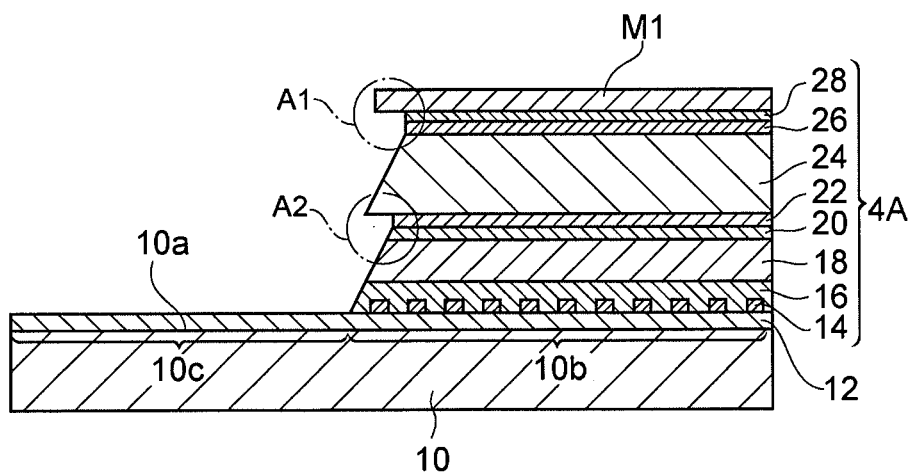

FIG. 5B is a sectional side view illustrating a section taken along line I-I in FIG. 5A. In the embodiment, the etched end surface of the first stacked semiconductor layer 4A is mainly constituted by the (111) planes and has a normal mesa structure. The etched end surface of the first stacked semiconductor layer 4A corresponds to the butt-joint surface formed in the second growth step described below. When the side-etching layer 26 is etched, the etching rate for the side-etching layer 26 is higher than that for the cladding layer 24. Accordingly, the end surface of the side-etching layer 26 is etched farther in than the end surfaces of the first etching mask M1 serving as an etching mask and the cladding layer 24. Thus, as illustrated in a portion A1 in FIG. 5B, an overhang constituted by the first etching mask M1 is formed between the first etching mask M1 and the cladding layer 24. In the embodiment, the capping layer 28 is formed between the first etching mask M1 and the side-etching layer 26. When the side-etching layer 26 is etched, the etching rate for the side-etching layer 26 is higher than that for the capping layer 28. Accordingly, another overhang constituted by the capping layer 28 may slightly remain. Similarly, when the first etch-stop layer 22 is etched, the etching rate for the first etch-stop layer 22 is higher than those for the cladding layer 24 and the cladding layer 20. Accordingly, the end surface of the first etch-stop layer 22 is etched farther in than the end surfaces of the cladding layer 24 and the cladding layer 20. Thus, as illustrated in a portion A2 in FIG. 5B, another overhang constituted by the cladding layer 24 is formed between the cladding layer 24 and the cladding layer 20.

<Second Growth Step>

Figure 6A:
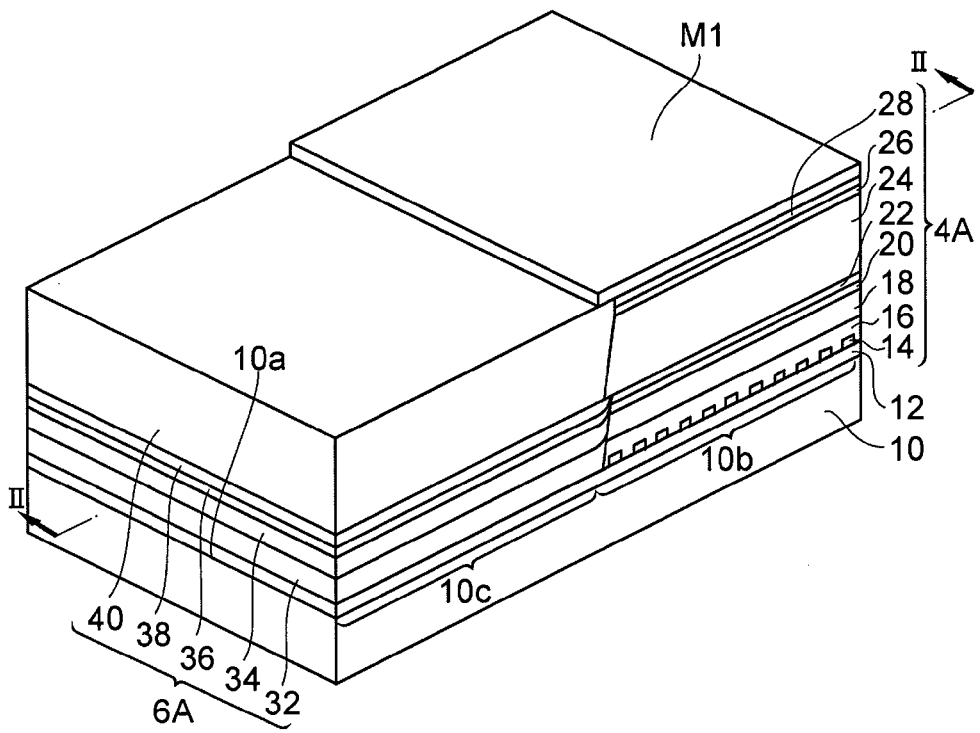
FIGS. 6A and 6B illustrate a second growth step.

Referring to FIG. 6A, on the second region 10c of the main surface 10a of the n-type InP substrate 10, a buffer layer 32 (thickness: 50 nm), an optical waveguiding layer 34, a cladding layer 36 (thickness: 60 nm), a second etch-stop layer 38 (thickness: 10 nm), and a cladding layer 40 are selectively grown through the first etching mask M1 (butt-joint coupling step, step S16 in FIG. 1). The thickness of the cladding layer 40 is adjusted such that the cladding layer 40 is flush with the upper surface of the capping layer 28. The buffer layer 32 is formed of, for example, n-type InP. The cladding layer 36 and the cladding layer 40 are formed of, for example, p-type InP. The cladding layer 40 serves as a second cladding layer in the embodiment. The cladding layer 40 has a larger thickness than a thickness of the cladding layer of the conventional integrated optical device having a 500 nm-thick cladding layer, for example. The cladding layer 40 has a thickness in the same range as the cladding layer 24 described above.

The second etch-stop layer 38 is different in composition from the cladding layer 40 and is positioned between the cladding layer 36 and the cladding layer 40. Specifically, the second etch-stop layer 38 is formed of a material allowing etching selectivity with respect to the cladding layer 40. The second etch-stop layer 38 is formed of, for example, p-type InGaAsP. The second etch-stop layer 38 has a bandgap wavelength of, for example, 1100 nm. The buffer layer 32, the cladding layer 36, the second etch-stop layer 38, and the cladding layer 40 have an impurity concentration of, for example, $5 \times 10^{17}$ cm$^{-3}$.

The optical waveguiding layer 34 serves as a second optical waveguiding layer in the embodiment. The optical waveguiding layer 34 has, for example, a multi quantum well (MQW) structure in which a barrier layer and a well layer are alternately stacked. The barrier layer is formed of, for example, InGaAsP, and has a bandgap wavelength of, for example, 1400 nm. The well layer is formed of, for example, InGaAsP and has a bandgap wavelength of, for example, 1500 nm. The barrier layer has a thickness of, for example, 10 nm. The well layer has a thickness of, for example, 6 nm. The well layer may have, for example, 1% compressive strain.

Figure 6B:
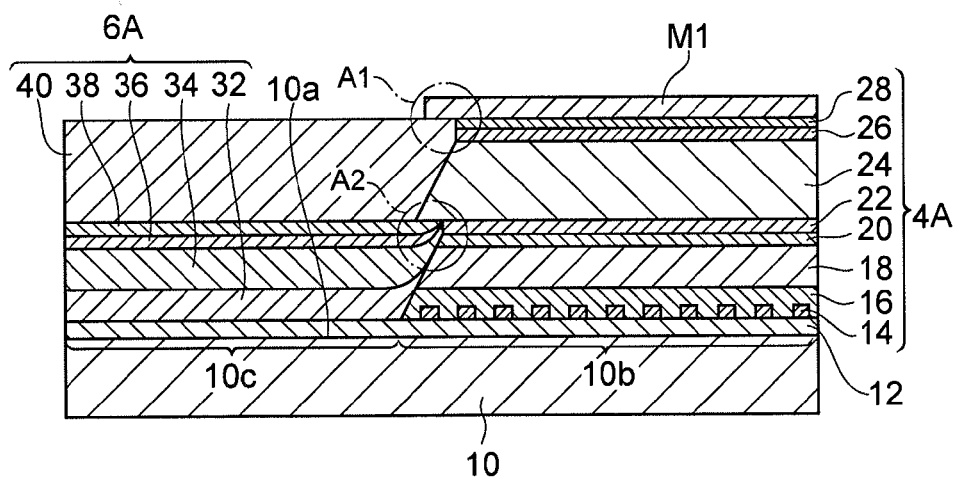

FIG. 6B is a sectional side view illustrating a section taken along line II-II in FIG. 6A. As a result of the above-described first etching step, the overhang is formed (portion A1 in FIG. 6B) between the cladding layer 24 and the first etching mask M1. During growth of the cladding layer 40 in the second growth step, this overhang effectively suppresses rising up of the cladding layer 40 in a region near the boundary between the cladding layer 40 and the first stacked semiconductor layer 4A. In addition, as a result of the above-described first etching step, another overhang is formed (portion A2 in FIG. 6B) between the cladding layer 20 and the cladding layer 24. During growth of the second optical waveguiding layer 34 in the second growth step, this overhang effectively suppresses rising up of the second optical waveguiding layer 34 in a region near the boundary between the second optical waveguiding layer 34 and the first stacked semiconductor layer 4A.

In the embodiment, during growth of the cladding layer 40, the growth temperature for the cladding layer 40 is made lower than the growth temperature for the optical waveguiding layer 34. In addition, during growth of the cladding layer 40, a V/III ratio (a ratio of a molar feed rate of a group V source gas to a molar feed rate of a group III source gas) is made higher than a V/III ratio in the growth of the optical waveguiding layer 34. In an example, growth conditions (growth temperature, growth rate, group V partial pressure, and V/III ratio) during growth of the optical waveguiding layer 34 and the cladding layer 40 in Table below are employed. Note that 1 (torr) is converted into 133.322 (Pa).

TABLE

Growth conditions for growing the optical waveguiding layer 34 and the cladding layer 40.

| | Growth Temperature (° C.) | Growth Rate (μm/hr) | Group V partial pressure (torr) | V/III ratio |
|---|---|---|---|---|
| Optical waveguiding layer 34 | 630 | 1.0 | 0.8 | 160 |
| Cladding layer 40 | 610 | 1.5 | 2.0 | 265 |

Figure 7:
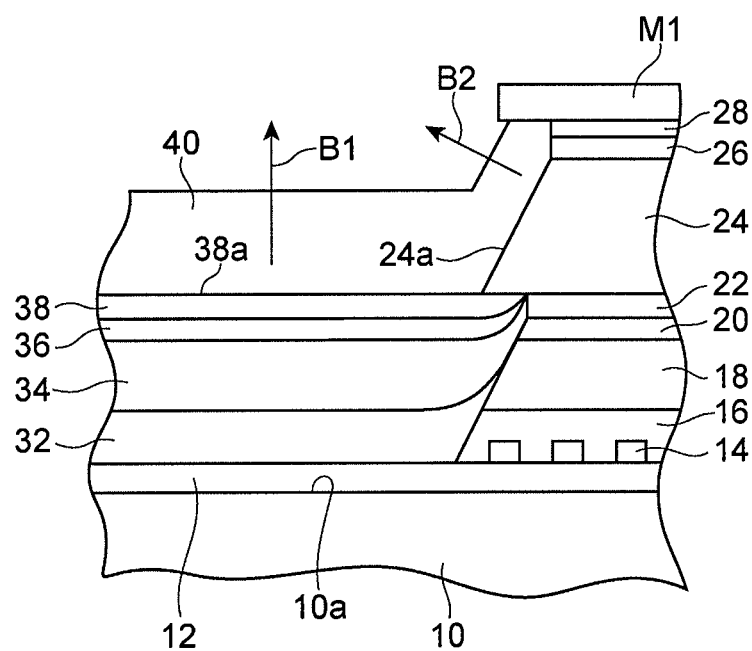
FIG. 7 is a schematic view illustrating growth of a second cladding layer.
Figure 17:
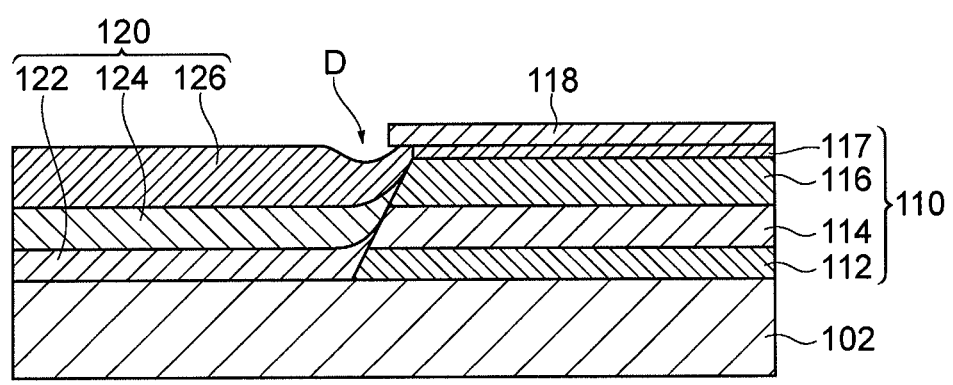
FIG. 17 is an explanatory view for a problem caused in an existing method for producing an integrated optical device having a butt-joint structure.

FIG. 7 is a schematic view illustrating growth of the cladding layer 40. As illustrated in FIG. 7, the cladding layer 40 is epitaxially grown on the main surface 10a (of the semiconductor substrate 10) mainly including the (001) plane (in the embodiment, on a surface 38a of the second etch-stop layer 38), and on the etched end surface (butt-joint surface) 24a (of the cladding layer 24) mainly including the (111) plane. At this time, the cladding layer 40 is generally grown under growth conditions suitable for growth on the main surface 10a mainly including the (001) plane. In particular, the growth conditions are determined such that a growth rate in a direction perpendicular to the main surface 10a (growth rate during growth of a semiconductor layer on the main surface 10a) becomes a predetermined rate. For example, the cladding layer 40 is grown under growth conditions in which the growth temperature is 630° C., the growth rate is 2.0 μm/h, the group V partial pressure is 1.0 torr, and the V/III ratio is 100. However, when the cladding layer 40 is grown under these growth conditions, a growth rate (arrow B2 in FIG. 7) on the butt-joint surface 24a having a plane orientation (for example, the (111) plane) different from the plane orientation of the main surface 10a is relatively low. That is, a growth rate (arrow B1 in FIG. 7) of the cladding layer 40 on the main surface 10a mainly including the (001) plane is higher than the growth rate of the cladding layer 40 on the butt-joint surface 24a mainly including the (111) plane. As a result, the recess D as illustrated in FIG. 17 is generated in the surface of the cladding layer 40.

In order to suppress the generation of the recess D so that the cladding layer 40 is formed so as to have a flat surface, in the embodiment, the cladding layer 40 is grown under the above-described growth conditions (refer to Table). By growing the cladding layer 40 under these growth conditions, the growth rate B2 of the cladding layer 40 on the butt-joint surface 24a can be increased and the growth rate B1 of the cladding layer 40 on the main surface 10a can be decreased. Accordingly, generation of the recess D as illustrated in FIG. 17 can be suppressed or the position where the recess D is generated can be sufficiently separated from the butt-joint surface 24a.

As a result of the above-described steps, a second stacked semiconductor layer 6A illustrated in FIGS. 6A and 6B is formed on the main surface 10a of the n-type InP substrate 10. The second stacked semiconductor layer 6A includes the buffer layer 32, the optical waveguiding layer 34, the cladding layer 36, the second etch-stop layer 38, and the cladding layer 40. The second stacked semiconductor layer 6A functions as, for example, an electric absorption (EA) optical modulator. The first etching mask M1 is then removed with, for example, hydrofluoric acid.

<Third Growth Step>

Figure 8A:
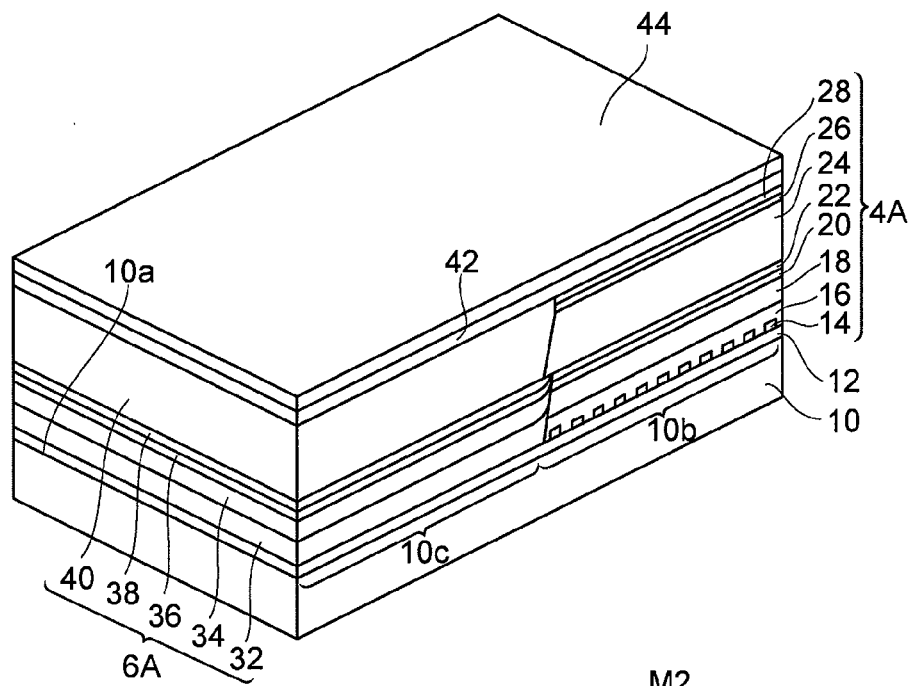
FIG. 8A illustrates a third growth step.

Referring to FIG. 8A, on the main surface 10a extending from the first stacked semiconductor layer 4A to the second stacked semiconductor layer 6A, a p-type cladding layer 42 (thickness: 150 nm) and a p-type contact layer 44 (thickness: 100 nm) are grown in this order (step S17 in FIG. 1). The p-type cladding layer 42 serves as an upper cladding layer in the embodiment. The p-type cladding layer 42 is formed of, for example, the same semiconductor material (p-type InP) as in the cladding layer 24 and the cladding layer 40. In the embodiment, the cladding layer 24 and cladding layer 40 have relatively large thicknesses comparing to the conventional integrated optical device. Therefore, the p-type cladding layer 42 has a relatively small thickness. The p-type contact layer 44 is formed of a semiconductor material that is used for forming an ohmic contact with an anode electrode (metal electrode) formed in a subsequent step. The p-type contact layer 44 is formed of, for example, p-type InGaAs. The p-type cladding layer 42 has an impurity concentration of, for example, $1 \times 10^{18}$ cm$^{-3}$. The p-type contact layer 44 has an impurity concentration of, for example, $1.5 \times 10^{19}$ cm$^{-3}$.

<Second Etching Step>

Figure 8B:
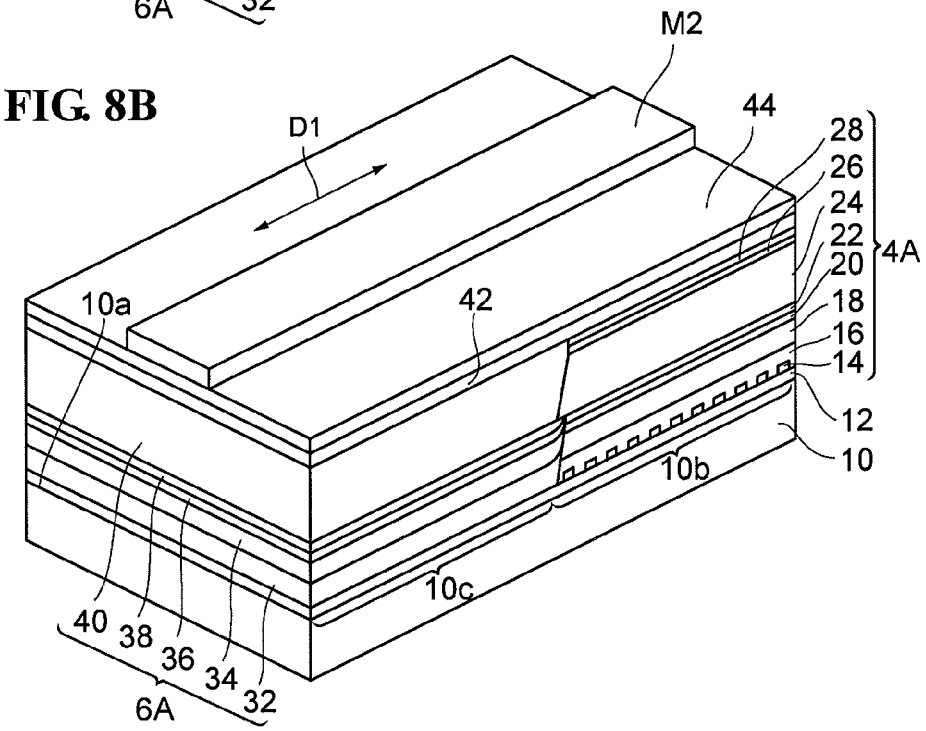
FIG. 8B illustrates a second etching step.
Figure 9:
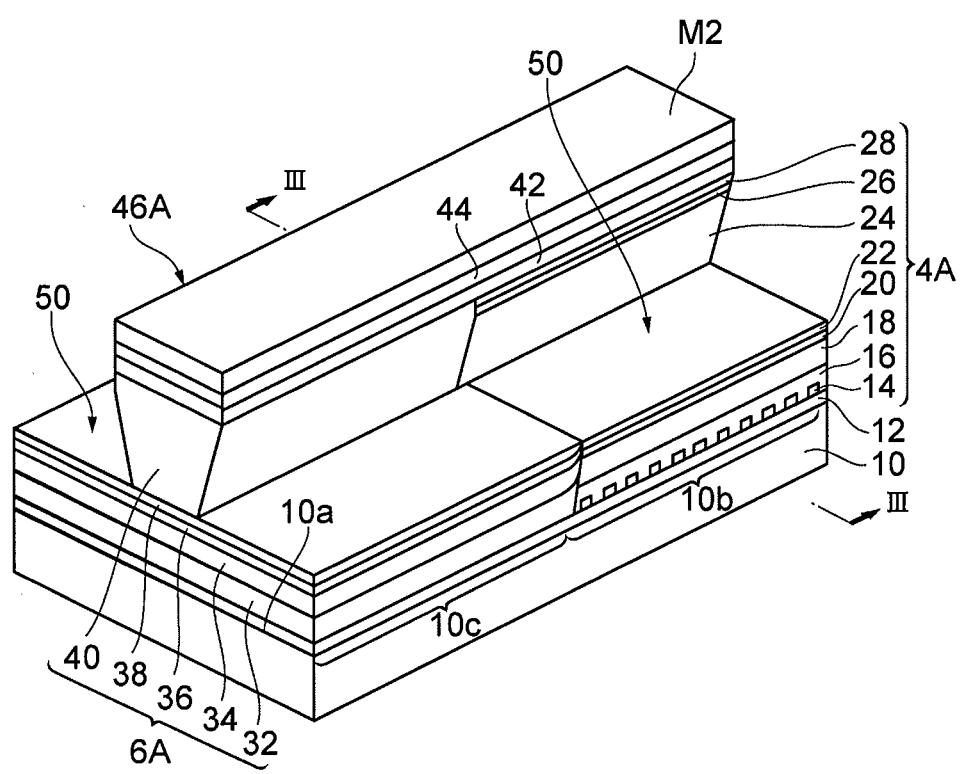
FIG. 9 illustrates a second etching step.

Referring to FIG. 8B, a second etching mask M2 longitudinally extending in the predetermined direction D1 is formed on the first stacked semiconductor layer 4A and the second stacked semiconductor layer 6A (in the embodiment, on the p-type contact layer 44) (step S18 in FIG. 1). The second etching mask M2 has the shape of a stripe. The second etching mask M2 is a dielectric film formed of, for example, SiO$_2$ or SiN. For example, a SiO$_2$ layer is deposited on the p-type contact layer 44 by a CVD method. After that, a resist mask is formed on the SiO$_2$ layer by the standard photolithography technique. The SiO$_2$ layer is etched through the resist mask. As a result, the second etching mask M2 is suitably formed. Referring to FIG. 9, the p-type contact layer 44, the p-type cladding layer 42, the cladding layer 24, and the cladding layer 40 are etched through the second etching mask M2 to form a ridge structure 46A (step S19 in FIG. 1).

On lateral sides of the second etching mask M2, other etching masks (not shown) having lateral edges extending along the lateral edges of the second etching mask M2 are further disposed so as to be separated from the second etching mask M2. Thus, each of the side surfaces of the ridge structure 46A constitutes a side wall of a groove 50 extending in the longitudinal direction (predetermined direction D1) of the ridge structure 46A and formed in the first and second stacked semiconductor layers 4A and 6A. In FIG. 9, in order to clearly illustrate the ridge structure 46A, the other side wall of the groove 50 is omitted (refer to FIG. 11A).

Figure 10A:
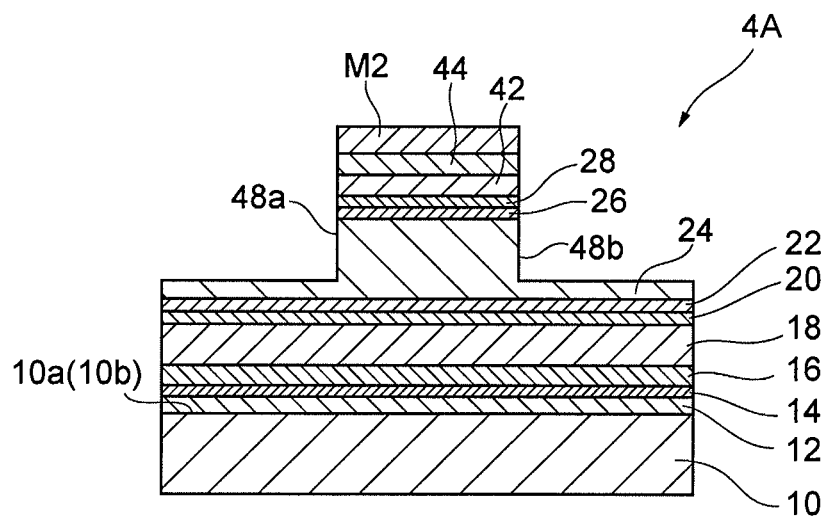
FIGS. 10A and 10B specifically illustrate a second etching step.
Figure 10B:
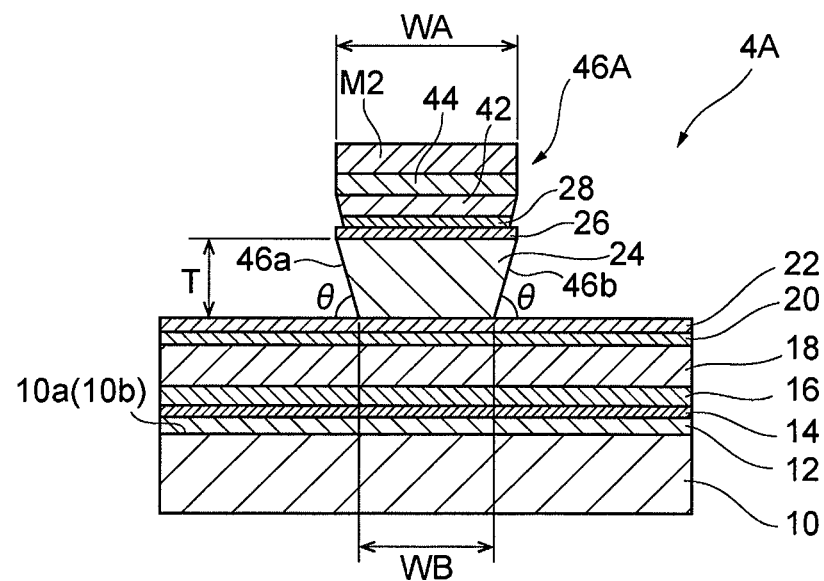

FIGS. 10A and 10B specifically illustrate the second etching step illustrated in FIG. 9. FIGS. 10A and 10B illustrate sections taken along line in FIG. 9 (sections of the first stacked semiconductor layer 4A). Note that sections of the second stacked semiconductor layer 6A are not indicated.

Referring to FIG. 10A, in the second etching step, the p-type contact layer 44, the p-type cladding layer 42, the cladding layer 24, and the cladding layer 40 are etched by dry etching using, for example, a gas mixture of methane gas ($CH_4$) and hydrogen gas ($H_2$) as an etching gas. This dry etching is stopped in the middle of the cladding layer 24 and the cladding layer 40. In this dry etching, the first and second etch-stop layers 22 and 38 are not exposed. As a result of the dry etching, side surfaces 48a and 48b for the ridge structure are formed so as to be substantially perpendicular to the main surface 10a.

Referring to FIG. 10B, the p-type cladding layer 42, the cladding layer 24, and the cladding layer 40 are etched by a wet etching technique (depth control substep). An etchant used for this wet etching preferably has higher etching rates for the cladding layers 24 and 40 than for the first and second etch-stop layers 22 and 38. In an example, an etchant containing hydrogen bromide can be used. The etching by the wet etching technique is stopped when the first and second etch-stop layers 22 and 38 are exposed. As a result of the etching by the wet etching technique, side surfaces 46a and 46b of the ridge structure 46A are formed. As illustrated in FIG. 10B, the side surfaces 46a and 46b constitute a reverse mesa structure with respect to the main surface 10a and mainly include, for example, the (111) planes of InP crystals.

In the first stacked semiconductor layer 4A, since the side-etching layer 26 is slowly etched, the width of the side-etching layer 26 is not substantially changed. Thus, as illustrated in FIG. 10B, a stepped structure is formed at the side-etching layer 26. As described above, the side surfaces 46a and 46b mainly include the (111) planes. That is, the angle formed by the side surfaces 46a and 46b and the main surface 10a of the n-type InP substrate 10 is solely determined. In the embodiment, the main surface 10a of the n-type InP substrate 10 has the (001) plane. In this case, the angle between the side surfaces 46a and 46b and the main surface 10a is 54.7 degrees. Accordingly, the width WB of the lower end portion (portion joined to the first etch-stop layer 22) of the ridge structure 46A is solely determined by the width of the side-etching layer 26 (that is, the width WA of the upper end portion of the ridge structure 46A) and the thickness T of the cladding layer 24. The width WA and the width WB are widths in a direction orthogonal to the predetermined direction D1.

As described above, the cladding layer 24 preferably has a thickness of 1.41 μm or more. When the cladding layer 24 has such a thickness, the width WA of the upper end portion of the ridge structure 46A can be made to be a sufficiently large width of 4.5 μm or more, and the width WB of the lower end portion of the ridge structure 46A can be made to be a sufficiently small width of 2.5 μm or less.

<Subsequent Steps>

As a result of the above-described steps, a substrate product in which the ridge structure 46A is formed in the first and second stacked semiconductor layers 4A and 6A is produced. FIGS. 11A to 13B are explanatory views for subsequent steps (step S20 in FIG. 1) for the substrate product. FIGS. 11A to 13A illustrate sections corresponding to sections taken along line in FIG. 8 (sections of the first stacked semiconductor layer 4A). The steps are similarly performed for the second stacked semiconductor layer 6A. FIG. 13B illustrates a section taken along line IV-IV in FIG. 13A.

Figure 11A:
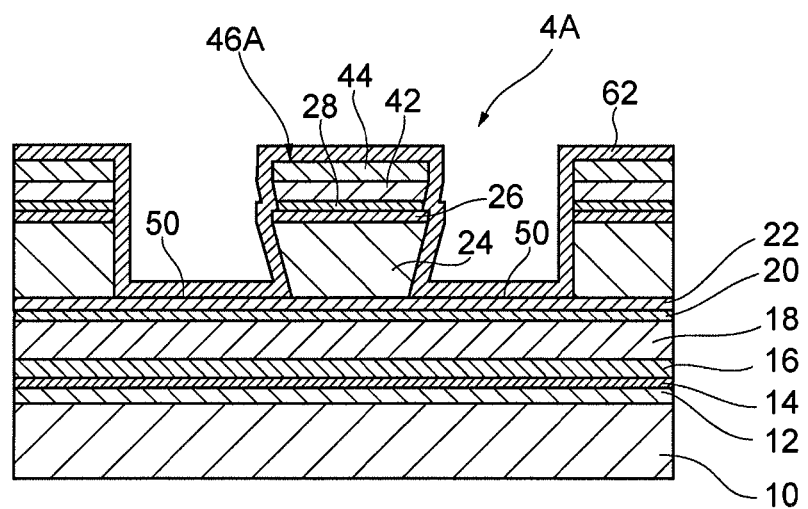
FIGS. 11A and 11B are explanatory views for subsequent steps for a substrate product.

The subsequent steps are performed in the following manner. Referring to FIG. 11A, a protective film (passivation film) 62 for protecting the first and second stacked semiconductor layers 4A and 6A is formed on the surfaces of the first and second stacked semiconductor layers 4A and 6A. At this time, for example, the protective film 62 is constituted by a dielectric film made of, for example, $SiO_2$ or SiN. The protective film 62 is formed by a CVD method. The protective film 62 is formed so as to cover at least the upper surface and side surfaces of the ridge structure 46A.

Figure 11B:
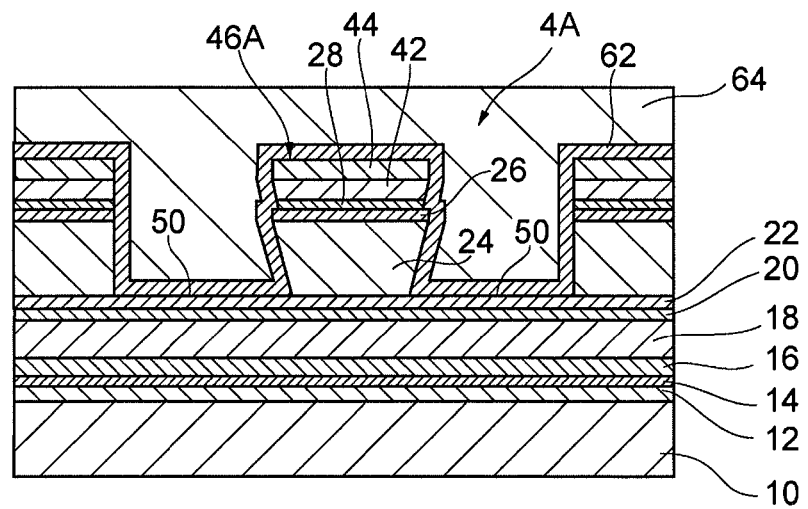

Referring to FIG. 11B, for example, a bisbenzocyclobutene (BCB) resin is then applied to the surfaces of the first and second stacked semiconductor layers 4A and 6A by spin coating to form a resin layer 64. The resin layer 64 is then heat-treated to be cured. As a result of this step, the grooves 50 formed on the lateral sides of the ridge structure 46A are filled with the resin layer 64. Thus, the resin layer 64 provides a flat surface for the substrate product. The resin layer 64 may be formed of a photosensitive BCB resin.

Figure 12A:
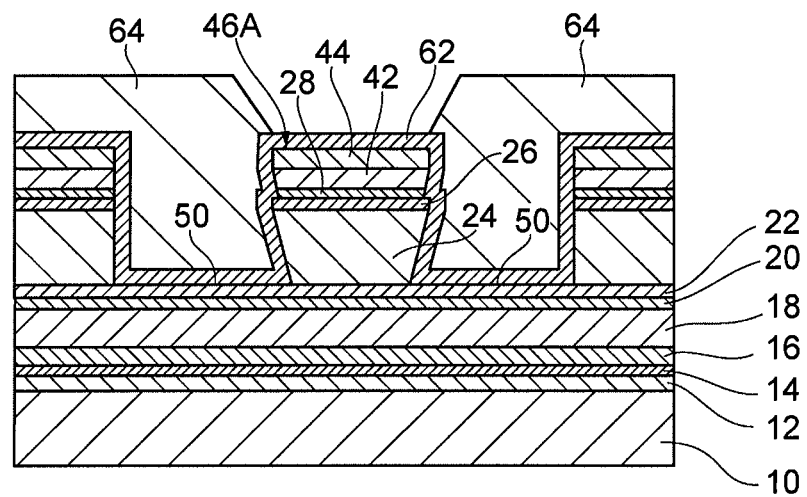
FIGS. 12A and 12B are explanatory views for subsequent steps for a substrate product.

Referring to FIG. 12A, the resin layer 64 is then exposed and developed by a photolithography technique to remove a portion of the resin layer 64 above the ridge structure 46A. As a result of this step, the protective film 62 on the ridge structure 46A is exposed.

Figure 12B:
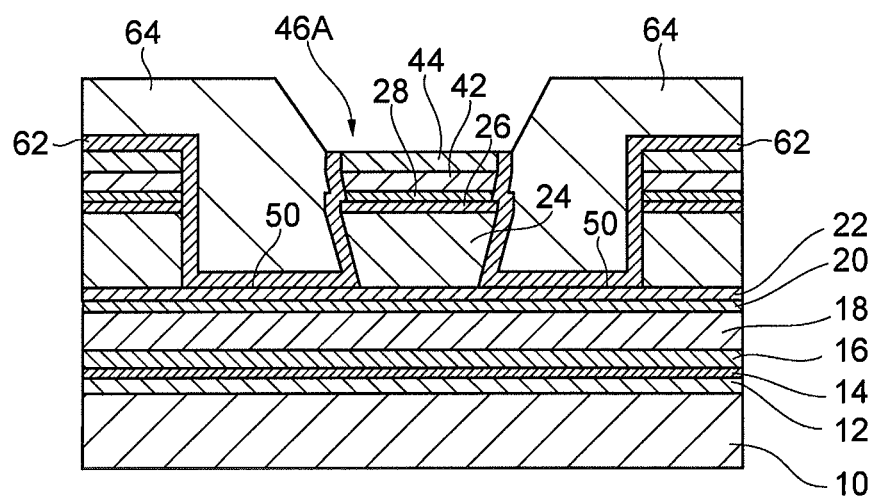

Referring to FIG. 12B, the protective film 62 on the ridge structure 46A is then removed by etching with the resin layer 64 serving as a mask. At this time, the protective film 62 is etched by a dry etching process with, for example, a CF-based gas. As a result of this step, the upper surface of the ridge structure 46A (p-type contact layer 44) is exposed.

Figure 13A:
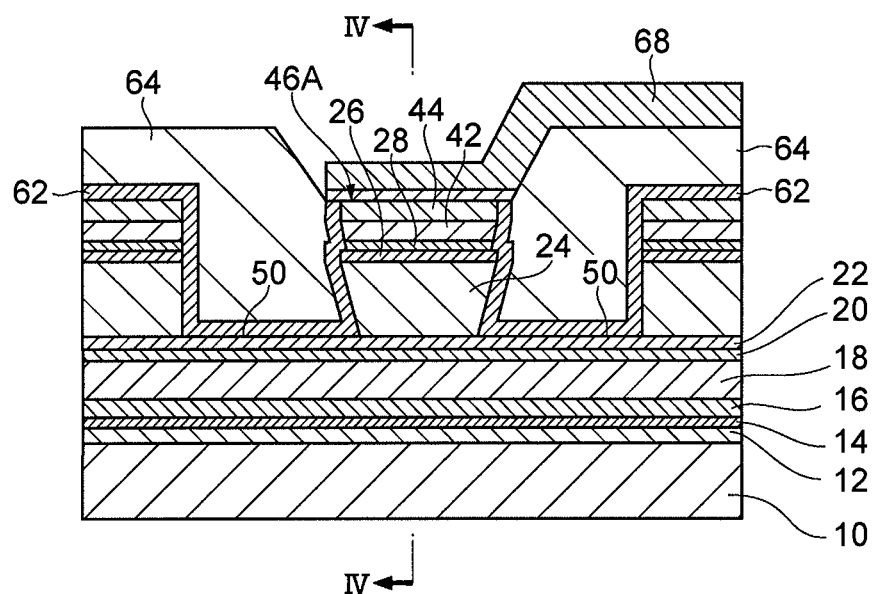
FIGS. 13A and 13B are explanatory views for subsequent steps for a substrate product.
Figure 13B:
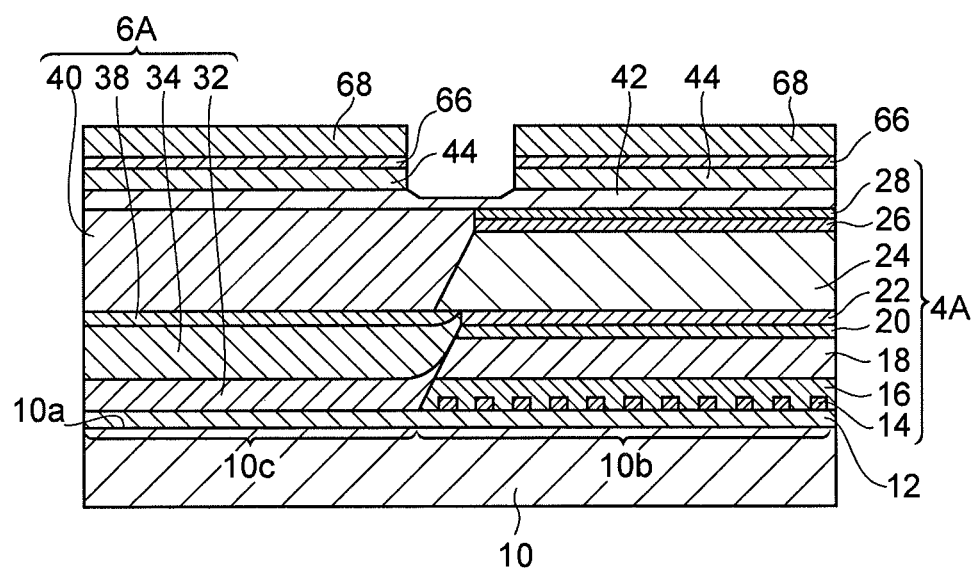
Figure 14A:
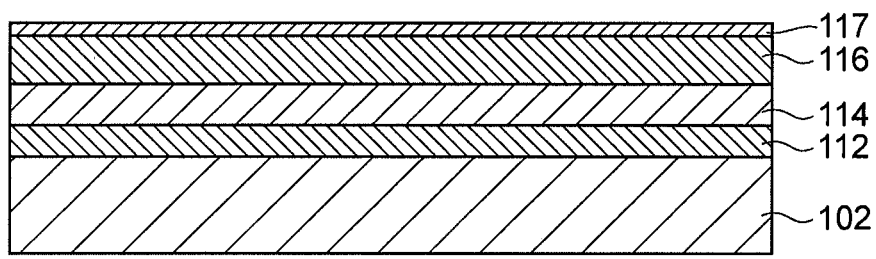
FIGS. 14A to 14C illustrate an example of a method for producing an integrated optical device having a butt-joint structure.
Figure 14B:
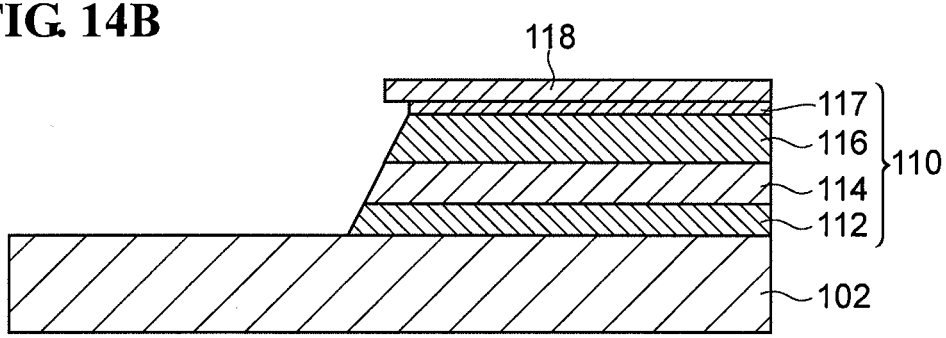
Figure 14C:
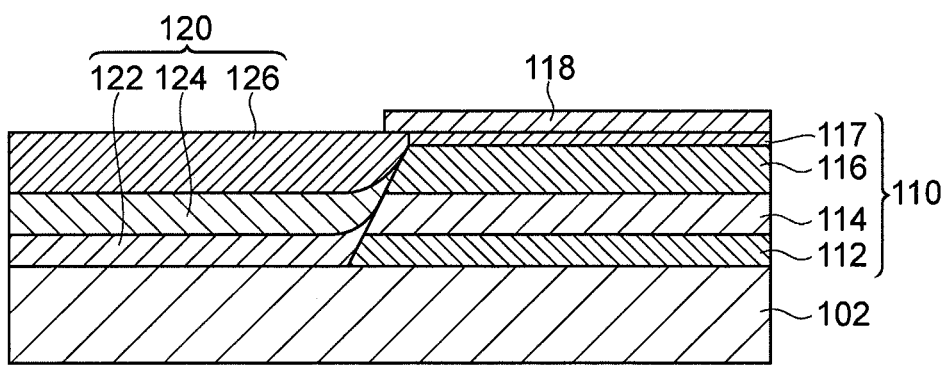
Figure 15A:
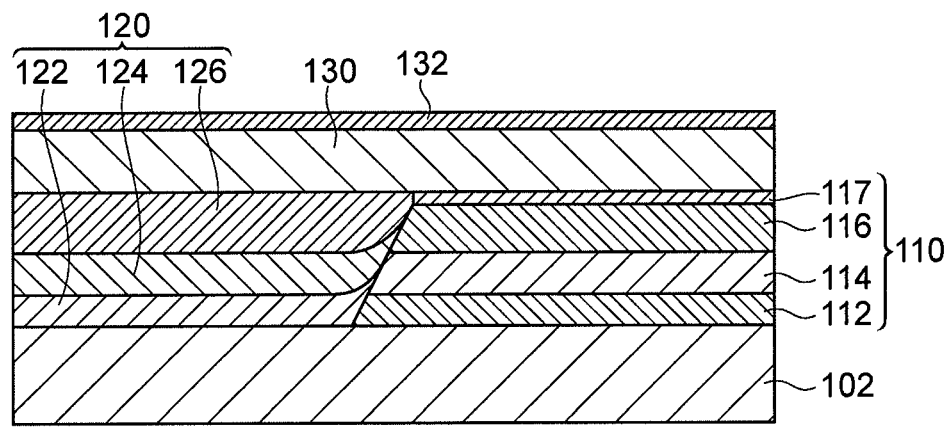
FIGS. 15A and 15B illustrate an example of a method for producing an integrated optical device having a butt-joint structure.
Figure 15B:
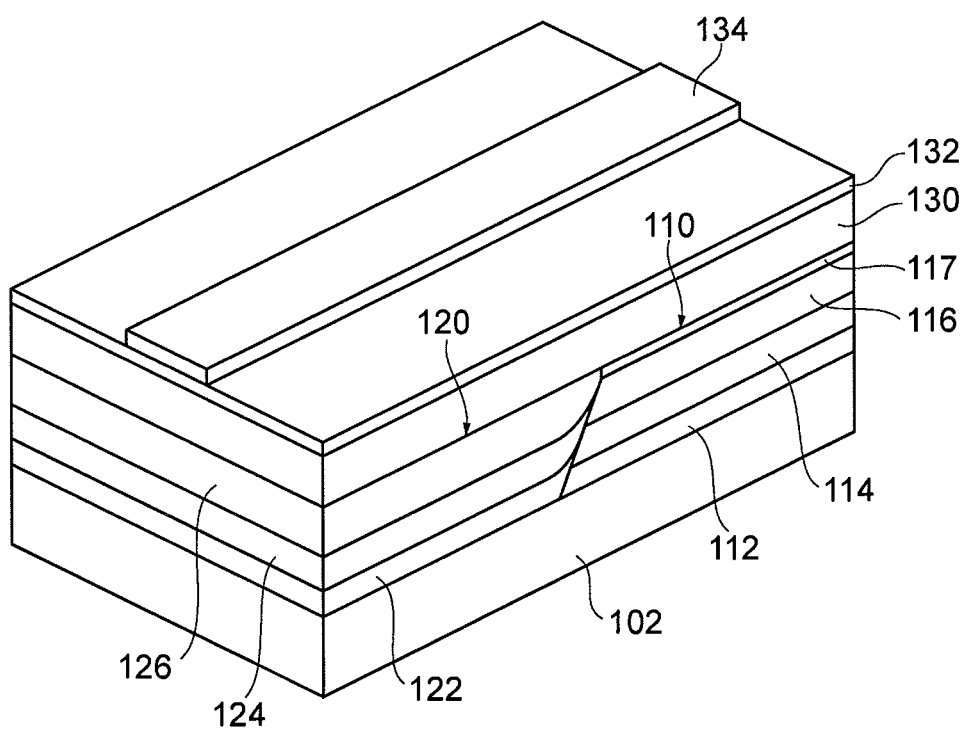
Figure 16A:
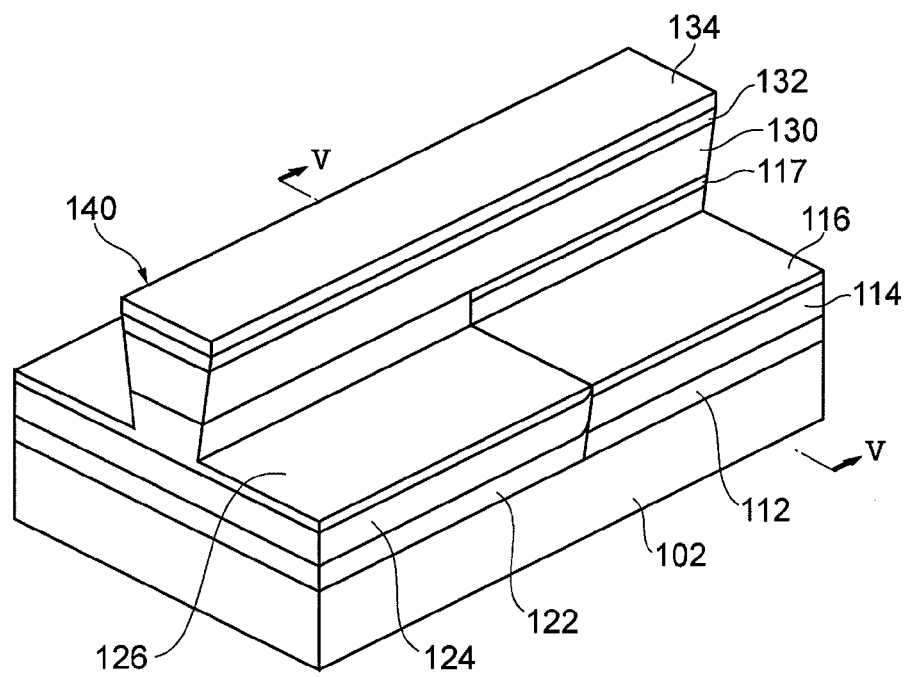
FIGS. 16A and 16B illustrate an example of a method for producing an integrated optical device having a butt-joint structure.
Figure 16B:
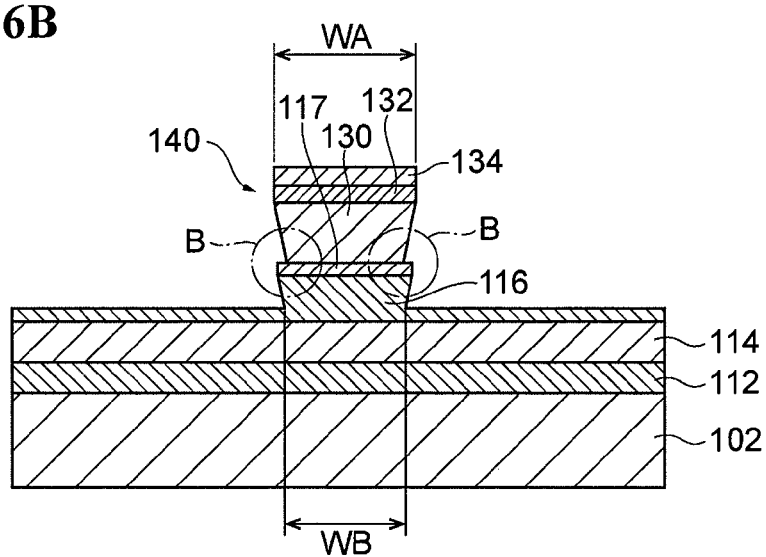

Referring to FIGS. 13A and 13B, an ohmic electrode 66 is then formed on the ridge structure 46A. In addition, a metal wire 68 is continuously formed on the ohmic electrode 66 and the resin layer 64. Referring to FIG. 13B, in order to electrically separate the ohmic electrode 66 and the metal wire 68 on the first stacked semiconductor layer 4A from the ohmic electrode 66 and the metal wire 68 on the second stacked semiconductor layer 6A, portions of the ohmic electrode 66 and the metal wire 68 are removed by etching. In addition, a portion of the p-type contact layer 44 is removed by etching to achieve separation between the p-type contact layer 44 on the first stacked semiconductor layer 4A and the p-type contact layer 44 on the second stacked semiconductor layer 6A.

After the above-described steps are performed, the resultant substrate product is divided into chips to complete integrated optical devices.

Advantages provided by the method for producing an integrated optical device according to the embodiment are summarized below. In the embodiment, in the second growth step, the growth temperature for the cladding layer 40 is made lower than the growth temperature for the optical waveguiding layer 34 and the V/III ratio in the growth of the cladding layer 40 is made higher than the V/III ratio in the growth of the optical waveguiding layer 34. By growing the cladding layer 40 under such growth conditions, the growth rate of the cladding layer 40 on the butt-joint surface 24a can be increased and the growth rate of the cladding layer 40 on the main surface 10a can be decreased. Accordingly, even when the cladding layer 40 is grown so as to have a large thickness, generation of the recess D as illustrated in FIG. 17 can be suppressed. By growing the cladding layer 40 so as to have a large thickness, the width WA of the upper end of the ridge structure 46A can be made large, and the width WB of the lower end of the ridge structure 46A can be made small.

The methods for producing an integrated optical device according to preferred embodiments of the present invention have been described so far with reference to examples, that is, structures in which a distributed feedback (DFB) laser diode and an EA optical modulator are integrated. However, the present invention is not necessarily limited to these embodiments and various modifications can be made without departing from the spirit and scope of the present invention.

What is claimed is:

1. A method for producing an integrated optical device, comprising the steps of:
    preparing a substrate including a main surface including first and second regions arranged in a predetermined direction;
    growing, on the first and second regions of the substrate, a first stacked semiconductor layer including a first optical waveguiding layer, a first cladding layer positioned on the first optical waveguiding layer, and a side-etching layer positioned on the first cladding layer, the side-etching layer having a composition different from a composition of the first cladding layer;
    etching the first stacked semiconductor layer through a first etching mask formed on the first region until the first optical waveguiding layer is exposed;
    selectively growing, on the second region through the first etching mask, a second stacked semiconductor layer including a second optical waveguiding layer coupled to the first optical waveguiding layer and a second cladding layer positioned on the second optical waveguiding layer; and
    forming a reverse-mesa ridge structure by etching the first and second cladding layers through a second etching mask formed on the first and second stacked semiconductor layers, the second etching mask longitudinally extending in the predetermined direction,
    wherein the step of etching the first stacked semiconductor layer includes a step of forming an overhang between the first etching mask and the first cladding layer by selectively etching the side-etching layer by wet etching with an etchant having a higher etching rate for the side-etching layer than for the first cladding layer, and
    in the step of selectively growing the second stacked semiconductor layer, the second cladding layer is grown at a growth temperature lower than a growth temperature of the second optical waveguiding layer and a V/III ratio higher than a V/III ratio in the growth of the second optical waveguiding layer.

2. The method according to claim 1, wherein, in the step of selectively growing the second stacked semiconductor layer, the second cladding layer is grown under the growth conditions so that a growth rate of the second cladding layer is increased on a side surface of the first stacked semiconductor layer exposed in the step of etching the first stacked semiconductor layer, and a growth rate of the second cladding layer is decreased on the main surface of the substrate.

3. The method according to claim 1, wherein
    the main surface of the substrate includes a (001) plane,
    in the step of etching the first stacked semiconductor layer, the first stacked semiconductor layer is etched by wet etching, and
    a side surface of the first stacked semiconductor layer exposed by the etching includes a (111) plane.

4. The method according to claim 1, wherein, in the step of etching the first stacked semiconductor layer, the first stacked semiconductor layer is etched with different etchants selected for the first optical waveguiding layer, the first cladding layer, and the side-etching layer in the first stacked semiconductor layer.

5. The method according to claim 1, wherein, in the step of growing the first stacked semiconductor layer, the first cladding layer has a thickness of 1.41 μm or more.

6. The method according to claim 5, wherein, in the step of forming the reverse-mesa ridge structure, the ridge structure has an upper end having a width of 4.5 μm or more in a direction orthogonal to the predetermined direction, and the ridge structure has a lower end having a width of 2.5 μm or less in the direction orthogonal to the predetermined direction.

7. The method according to claim 1, wherein, in the step of forming the reverse-mesa ridge structure, the first and second cladding layers are etched by dry etching, and after etching by dry etching, the first and second cladding layers are subsequently etched by wet etching.

* * * * *